(12) United States Patent
Sridharan et al.

(10) Patent No.: US 8,889,041 B2
(45) Date of Patent: Nov. 18, 2014

(54) METHOD OF MAKING SOLAR CELL CONTACTS

(75) Inventors: Srinivasan Sridharan, Strongsville, OH (US); Tung Pham, Vista, CA (US); Chandrashekhar S. Khadilkar, Broadview heights, OH (US); Aziz S. Shaikh, San Diego, CA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 0 days.

(21) Appl. No.: 12/573,209

(22) Filed: Oct. 5, 2009

(65) Prior Publication Data

US 2010/0096598 A1 Apr. 22, 2010

Related U.S. Application Data

(63) Continuation of application No. 10/988,208, filed on Nov. 12, 2004, now abandoned.

(51) Int. Cl.
*H01L 31/0224* (2006.01)
*C03C 8/18* (2006.01)
*C03C 3/072* (2006.01)
*C03C 3/07* (2006.01)

(52) U.S. Cl.
CPC ......... *H01L 31/022425* (2013.01); *C03C 8/18* (2013.01); *C03C 3/072* (2013.01); *Y02E 10/50* (2013.01); *C03C 3/07* (2013.01)
USPC ............................. 252/514; 136/256; 438/98

(58) Field of Classification Search
USPC .................................................. 428/323–331
See application file for complete search history.

(56) References Cited

U.S. PATENT DOCUMENTS

| | | | |
|---|---|---|---|
| 3,839,231 A | 10/1974 | Patterson et al. | |
| 4,400,214 A * | 8/1983 | Ogawa et al. | 106/1.13 |
| 4,486,232 A | 12/1984 | Nakatani et al. | |
| 5,118,362 A * | 6/1992 | St. Angelo et al. | 136/256 |
| 5,151,377 A | 9/1992 | Hanoka et al. | |
| 5,198,154 A | 3/1993 | Yokoyama et al. | |
| 5,557,146 A * | 9/1996 | Britt et al. | 257/741 |
| 5,698,451 A | 12/1997 | Hanoka | |
| 5,841,044 A | 11/1998 | Weise et al. | |
| 5,948,320 A | 9/1999 | Nikaidoh et al. | |
| 6,036,889 A * | 3/2000 | Kydd | 252/512 |
| 6,225,392 B1 * | 5/2001 | Sunahara | 524/404 |
| 6,277,169 B1 * | 8/2001 | Hampden-Smith et al. | 75/336 |
| RE37,512 E | 1/2002 | Szlufcik et al. | |
| 6,632,730 B1 | 10/2003 | Meier et al. | |
| 6,664,631 B2 | 12/2003 | Meier et al. | |
| 2003/0209697 A1 * | 11/2003 | Orsbon et al. | 252/500 |

FOREIGN PATENT DOCUMENTS

| | | | |
|---|---|---|---|
| JP | 58-083073 | * | 5/1983 |
| JP | 58083073 A | | 5/1983 |
| WO | 03/025954 A1 | | 3/2003 |
| WO | WO/2006/055126 | | 5/2006 |

OTHER PUBLICATIONS

Khadilkar et al., "Characterization of Front Contact in a Silicon Solar Cell", presented Aug. 10-13, 2003.
Shaikh et al. "Designing a Front Contact Ink for SiNx Coated Polycrystalline Si Solar Cells", presented May 11-18, 2003.
Surek, "Progress in U.S. Photovoltaics: Looking Back 30 Years and Looking Ahead 20", 3rd World Conference, Osaka, Japan, May 11-18, 2003, pp. 1-6.
English Abstract for JP 2003-165744, published Jun. 10, 2003 and a Machine Translation Thereof.

* cited by examiner

*Primary Examiner* — Jayne Mershon
(74) *Attorney, Agent, or Firm* — Blank Rome LLP

(57) ABSTRACT

Formulations and methods of making solar cells are disclosed. In general, the invention presents a solar cell contact made from a mixture wherein the mixture comprises a solids portion and an organics portion, wherein the solids portion comprises from about 85 to about 99 wt % of silver, and from about 1 to about 15 wt % of a glass component wherein the glass component comprises from about 15 to about 75 mol % PbO, and from about 5 to about 50 mol % $SiO_2$, and preferably with no $B_2O_3$.

33 Claims, No Drawings

METHOD OF MAKING SOLAR CELL CONTACTS

CROSS REFERENCES TO RELATED APPLICATIONS

This application is a continuation application and claims priority from U.S. application Ser. No. 10/988,208 filed on Nov. 12, 2004.

FIELD OF THE INVENTION

This invention relates to a paste composition and a method of making contacts for solar cells as well as other related components used in fabricating photovoltaic cells.

BACKGROUND

Solar cells are generally made of semiconductor materials, such as silicon (Si), which convert sunlight into useful electrical energy. Solar cells are, in general, made of thin wafers of Si in which the required PN junction is formed by diffusing phosphorus (P) from a suitable phosphorus source into a P-type Si wafer. The side of silicon wafer on which sunlight is incident is in general coated with an anti-reflective coating (ARC) to prevent reflective loss of incoming sunlight, and thus to increase the efficiency of the solar cell. A two dimensional electrode grid pattern known as a front contact makes a connection to the N-side of silicon, and a coating of aluminum (Al) on the other side (back contact) makes connection to the P-side of the silicon. These contacts are the electrical outlets from the PN junction to the outside load.

SUMMARY OF THE INVENTION

The present invention provides glass compositions for use in front contact paste materials that provide low series resistance (Rs) and high shunt resistance ($R_{sh}$) to give high performance solar cells, as measured by efficiency ($\eta$) and fill factor (FF). Generally, the present invention includes a solar cell contact made from a mixture of ingredients, wherein the mixture comprises a solids portion and an organics portion. The solids portion comprises from about 85 to about 99 wt % of a metal component preferably silver, and from about 1 to about 15 wt % of a glass component. The glass component comprises from about 15 to about 75 mol % PbO, and from about 5 to about 50 mol % $SiO_2$. The metal component comprises silver flakes, silver power, colloidal silver, and/or phosphorus-coated silver powder. Methods for making solar cells using the above ingredients and amounts are also envisioned.

The compositions and methods of the present invention overcome the drawbacks of the prior art by facilitating optimized interaction, bonding, and contact formation between front contact components, typically Ag and Si, through the glass medium. A conductive paste containing glass and silver is printed on a silicon substrate, and fired to fuse the glass and sinter the metal therein. Upon firing, Ag/Si conductive islands are formed providing conductive bridges between bulk paste and silicon wafer. Leaded glasses allow low firing temperatures owing to their excellent flow characteristics relatively at low temperatures.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION

The foregoing and other features of the invention are hereinafter more fully described. Silver- and glass-containing thick film pastes are used to make front contacts for silicon-based solar cells to collect current generated by exposure to light. The cell electrical performance as measured by cell efficiency ($\eta$) and fill factor (FF) is strongly affected by the microstructure and the electrical properties of the silver/silicon interface. The electrical properties of the solar cell are also characterized by $R_S$ and $R_{sh}$. The composition and microstructure of the front contact interface largely determine $R_S$. While the paste is generally applied by screen-printing, methods such as extrusion, pad printing, and hot melt printing may be used. Solar cells with screen-printed front contacts are fired to relatively low temperatures (550° C. to 850° C. wafer temperature; firing furnace set temperatures of 650° C. to 1000° C.) to form a low resistance contact between the N-side of a phosphorus doped silicon wafer and a silver based paste. The front contact paste, before firing, contains a silver-containing compound in one or more forms (powder, flake, colloid) and a glass component, and/or other additives. The glass component contains at least PbO and $SiO_2$.

The sequence and rates of reactions occurring as a function of temperature are factors in forming the low resistance contact between the silver paste and silicon wafer. The interface structure consists of multiple phases: substrate silicon, Ag/Si islands, Ag precipitates within the insulating glass layer, and bulk silver. The glass forms a nearly continuous layer between the silicon interface and the bulk silver.

Solar cells include a front contact made from pastes or inks consisting of a mixture of ingredients. These mixtures, prior to firing, comprise a solids portion and an organics portion. The solids portion comprises a conductive metal and a glass component. Up to about 30 wt % of other (i.e., inorganic) additives, preferably up to about 25 wt % and more preferably up to about 10 wt %, may be included as needed. The solids portion for the paste composition according to the present invention comprises: (a) a metal component comprising silver, an alloy of silver, or an oxide of silver, or a silver compound (i.e., silver component), from about 85 to about 99 wt %, preferably from about 88 to about 95 wt % of the solids portion; and, (b) a glass component, from about 1 to about 15 wt %, preferably about 2 to about 9 wt %, and more preferably from about 3 to about 8 wt % of the solids portion. The organics portion of the pastes herein comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, resin, thixotrope, and wetting agent is also envisioned. Although a variety of weight ratios of the solids portion to the organics portion are envisioned, one embodiment includes a weight ratio of the solids portion to the organics portion from about 20:1 to about 1:20. In preferred embodiments the weight ratio is from about 15:1 to about 1:15, and most preferably the ratio is about 10:1 to about 1:10. Each of the major ingredient types (glass, metal, organics) is detailed hereinbelow.

Paste Glasses. The glass component comprises, prior to firing, one or more glass compositions. Each glass composition comprises oxide frits including, at a minimum, PbO and $SiO_2$. Zinc oxide (ZnO) may replace a portion of the PbO in the glass component herein. In particular, in various embodiments of the present invention, a glass composition comprises the ingredients of Table 1. When at least two glass compositions are present, the selection of their makeup and proportions has an effect on the quality of the solar cell contact. The use of a (first) glass composition containing a high proportion of ZnO (e.g., up to about 35 mol %) provides minimum penetration into silicon. Such a glass composition is exemplified by embodiments V and VII in Table 3, and composition A in Table 4. On the other hand the use of a (second) zinc-free glass composition with high proportion of PbO (e.g., up to about 75 mol %) provides more penetration into silicon. Such a glass composition is exemplified by embodiments VI, VIII, IX, X, and XI in Table 3, and compositions B, C, D, and E in Table 4. Regardless of the number of glass compositions used, the total content of PbO and $SiO_2$ in the glass component overall will fall within the range of about 15 to about 75 mol % PbO, and from about 5 to about 50 mol % $SiO_2$. Varying proportions of the first and second glass compositions can be used in forming a solar cell contact to control, the extent of penetration into silicon, and hence the resultant solar cell properties. For example, within the glass component, the first and second glass compositions may be present in a weight ratio of about 1:20 to about 20:1, and preferably about 1:3 to about 3:1. The glass component preferably contains no cadmium or oxides of cadmium. Further, a portion of PbO can be replaced by $Bi_2O_3$ to provide a glass composition used in making a solar cell within the scope of the present invention. For example, about 1 to about 30 mol % of $Bi_2O_3$ can be used.

Other embodiments may further comprise $Al_2O_3$, $Ta_2O_5$, $Sb_2O_5$, $ZrO_2$, $HfO_2$, $In_2O_3$, $Ga_2O_3$, $Y_2O_3$, $Yb_2O_3$ and combinations thereof. An entry such as $Y_2O_3+Yb_2O_3$ means that $Y_2O_3$ or $Yb_2O_3$ or a combination of the two is present in the specified amount. The embodiments set forth in Table 1, may in addition include the following oxide frit ingredients as shown in Table 2.

TABLE 1

Oxide frit ingredients in mole percent of the glass component.

| | Glass Composition | | |
|---|---|---|---|
| Ingredient | I (broad) | II (preferred) | III (more preferred) |
| PbO | 15-75 | 25-66 | 30-64 |
| $SiO_2$ | 5-50 | 15-40 | 20-35 |
| ZnO | 0-50 | 5-35 | 20-33 |
| PbO + ZnO | 15-80 | — | — |

TABLE 2

Additional oxide frit ingredients in embodiments of Table 1 in mole percent of the glass component.

| | Glass Composition | | |
|---|---|---|---|
| Ingredient | I (broad) | II (preferred) | III (more preferred) |
| $Al_2O_3$ | 0-15 | 1-11 | 2-10 |
| $Ta_2O_5$ | 0.1-10 | 0.1-3 | 0.2-2 |
| $Sb_2O_5$ | 0.1-10 | 0.1-3 | 0.2-2 |
| $ZrO_2$ | 0.1-10 | 0.5-5 | 1-2 |
| $P_2O_5$ | 0.1-8 | 1-5 | 2-4 |
| $MoO_3$ | 0.1-3 | — | — |
| $HfO_2 + In_2O_3 + Ga_2O_3$ | 0.1-15 | 1-10 | 3-8 |
| $Y_2O_3 + Yb_2O_3$ | 0.1-10 | 1-8 | 3-8 |

A given embodiment need not contain all frit ingredients as noted in Table 2, but various combinations are possible. Other specific embodiments may contain various amounts of the aforementioned ingredients in mole percent as shown in Table 3.

TABLE 3

Further embodiments of glass compositions in the glass component in mole percent of the glass component.

| | Glass Composition | | | | | | | |
|---|---|---|---|---|---|---|---|---|
| Ingredient | IV | V | VI | VII | VIII | IX | X | XI |
| PbO | 58-64 | 25-40 | 58-64 | 26-34 | 58-66 | 58-66 | 58-70 | 58-66 |
| $SiO_2$ | 25-31 | 20-31 | 22-32 | 27-33 | 20-31 | 20-31 | 20-31 | 20-32 |
| ZnO | 0-10 | 5-34 | | 27-33 | | | | |
| $Al_2O_3$ | 2-11 | 4-10 | 1-10 | 5-11 | 1-9 | 1-9 | 1-11 | 1-9 |
| $Ta_2O_5$ | | 0-2 | | 0.1-2 | 0.1-2 | | | |
| $P_2O_5$ | | | | | | | | 0.1-4 |
| $HfO_2 + In_2O_3 + Ga_2O_3$ | | | 0.1-8 | | | | | |
| $ZrO_2$ | | | | | 0.1-5 | | 0.1-2 | 0.1-4 |
| $B_2O_3$ | | | | | | 0-3 | | |
| $Sb_2O_5$ | | | | | | 0.1-3 | | |

Silver Component. The source of the silver in the silver component can be one or more fine powders of silver metal, or alloys of silver. A portion of the silver can be added as silver oxide ($Ag_2O$) or as silver salts such as AgCl, $AgNO_3$ or $AgOOCCH_3$ (silver acetate). Additionally, the silver may be coated with various materials such as phosphorus. Alternately, the silver oxide can be dissolved in the glass during the glass melting/manufacturing process. The silver particles used in the paste may be spherical, flaked, or provided in a colloidal suspension, and combinations of the foregoing may be used. Any of the aforementioned silver sources may be used to contribute silver to the silver component of the solar cell contacts herein. For example the solids portion of the paste may comprise about 80 to about 99 wt % spherical silver particles or about 75 to about 90 wt % silver particles and about 1 to about 10 wt % silver flakes. Another alternative composition of the solids portion comprises about 75 to about 90 wt % silver flakes and about 1 to about 10 wt % of colloidal silver. In general, the solids portion may comprise about 60 to about 95 wt % of silver powder or silver flakes and about 0.1 to about 20 wt % of colloidal silver. Suitable commercial examples of silver particles are spherical silver powder Ag3000-1, silver flakes SF-23, and colloidal silver suspension RDAGCOLB, all commercially available from Ferro Corporation, Cleveland, Ohio.

Inorganic/Other Additives. Phosphorus can be added to the paste in a variety of ways to reduce the resistance of the front contacts. For example, certain glasses can be modified with $P_2O_5$ in the form of a powdered or fritted oxide, or phosphorus can be added to the paste by way of phosphate esters and other organo-phosphorus compounds. More simply, phosphorus can be added as a coating to silver particles prior to making a paste. In such case, prior to pasting, the silver particles are mixed with liquid phosphorus and a solvent. For example, a blend of from about 85 to about 95 wt % silver particles, from about 5 to about 15 wt % solvent and from about 0.5 to about 10 wt % liquid phosphorus is mixed and the solvent evaporated. Phosphorus coated silver particles help ensure intimate mixing of phosphorus and silver in the inventive pastes.

Other additives such as fine silicon or carbon powder, or both, can be added to the paste to control the silver reduction and precipitation reaction. The silver precipitation at the interface or in the bulk glass, can also be controlled by adjusting the firing atmosphere (e.g., firing in flowing $N_2$ or $N_2/H_2/H_2O$ mixtures). Fine low melting metal additives (i.e., elemental metallic additives as distinct from metal oxides) such as Pb, Bi, In, Ga, Sn, and Zn and alloys of each with at least one other metal can be added to provide a contact at a lower temperature, or to widen the firing window. Zinc is the preferred metal additive, and silver is the preferred metal with which the metal additive is alloyed. A zinc-silver alloy is most preferred.

A mixture of (a) glasses or a mixture of (b) glasses and crystalline additives or a mixture of (c) one or more crystalline additives can be used to formulate a glass component in the desired compositional range. The goal is to reduce the contact resistance and improve the solar cell electrical performance. For example, second-phase crystalline materials such as $Bi_2O_3$, $Sb_2O_3$, $Sb_2O_5$, $In_2O_3$, $Ga_2O_3$, SnO, ZnO, $Pb_3O_4$, PbO, $SiO_2$, $ZrO_2$, $Al_2O_3$, $B_2O_3$, and $Ta_2O_5$ may be added to the glass component to adjust contact properties. Combinations and reaction products of the aforementioned oxides can also be suitable to design a glass component with desired characteristics. For example, low melting lead silicates, either crystalline or glassy, formed by the reaction of PbO and $SiO_2$ such as $4PbO.SiO_2$, $3PbO.SiO_2$, $2PbO.SiO_2$, $3PbO.2SiO_2$, and $PbO.SiO_2$, either singly or in mixtures can be used to formulate a glass component. A second phase of lead silicates may optionally be used. Other reaction products of the aforementioned oxides such as $ZnO.SiO_2$ and $ZrO_2.SiO_2$ may also be used. However, the total amounts of the above oxides must fall within the ranges specified for various embodiments disclosed elsewhere herein.

The inventors herein have found that boron content (as $B_2O_3$) has an effect on contact formation. The presence of high amounts (>10 mol %) of $B_2O_3$ can cause poor contact formation, especially contacts with high $R_S$. Accordingly, in a preferred embodiment, the glass component contains no more than about 3 mol % of $B_2O_3$, preferably no more than about 1 mol % $B_2O_3$. Most preferably, the glass component contains no $B_2O_3$.

The inventors herein have also found that certain glasses containing oxides of hafnium ($HfO_2$), indium ($In_2O_3$), and/or gallium ($Ga_2O_3$) increase both the size and quantity of the conductive Ag/Si islands. Hence, up to 15 mol % of $HfO_2$ and/or $In_2O_3$ and/or $Ga_2O_3$ may be included in the glass component.

Oxides of tantalum and molybdenum reduce glass viscosity and surface tension of the glass during firing, facilitating better wetting of the wafer by the molten glass. Accordingly, up to about 10 mol % $Ta_2O_5$, and up to about 3 mol % $MoO_3$ can be included in the glass component.

Kinetics of silver dissolution and precipitation from the glass compositions can be significantly altered by the presence of alkali metal oxides. In that regard, the compositions of the present invention may further comprise oxides of alkali metals, for example $Na_2O$, $K_2O$, and $Li_2O$ and combinations thereof. In particular, the glass components of certain embodiments herein may contain from about 0.1 to about 15 mol % $Na_2O+K_2O+Li_2O$, or more preferably from about 0.1 to about 5 mol % of those alkali metal oxides.

The glass in the front contact paste or ink plays many key roles in forming an efficient front contact silver-silicon interface. The front contact paste glass corrodes the antireflective coating, typically made of silicon nitride ($SiN_x$) or titanium dioxide ($TiO_2$) to form fired through contacts to underlying Si. The glass also takes part in a self-limiting interaction with Si to oxidize and dissolve a portion of Si into the glass as $SiO_2$. Because the local concentration of $SiO_2$ increases the viscosity of the glass, this increase will eventually limit further dissolution of Si as $SiO_2$, giving rise to a self-limiting interaction of the glass with Si to preserve the PN junction. The glass also dissolves Ag metal into the glass, transports Ag ions to the silicon interface, and precipitates Ag from the glass to form beneficial Ag/Si islands at the interface. Finally, the glass serves to enhance densification of the silver paste to reduce bulk silver resistivity and enhances bonding (adhesion) between the silicon wafer and the fired (silver) paste.

Organic Vehicle. The vehicle or carrier for most conductive compositions is typically a solution of a resin dissolved in a solvent and, frequently, a solvent solution containing both resin and a thixotropic agent. The solvent usually boils from about 130° C. to about 350° C. The most frequently used resin for this purpose is ethyl cellulose. However, resins such as ethyl hydroxy ethyl cellulose, wood rosin, mixtures of ethyl cellulose and phenolic resins, polymethacrylates of lower alcohols and the monobutyl ether of ethylene glycol monoacetate can also be used. The most widely used solvents for thick film applications are terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate. The vehicle can contain organometallic compounds, for example those based on nickel, phosphorus or silver, to modify the contact. Various combinations of these and other solvents can be formulated to obtain the desired viscosity and volatility requirements for each application. Other dispersants, surfactants and rheology modifiers, which are commonly used in thick film paste formulations, may be included. Products useful in the organic carrier may be obtained commercially under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.). N-DIFFUSOL® is a stabilized liquid preparation containing an n-type diffusant with a diffusion coefficient similar to that of elemental phosphorus.

Among commonly used organic thixotropic agents is hydrogenated castor oil and derivatives thereof. A thixotrope is not always necessary because the solvent/resin properties coupled with the shear thinning inherent in any suspension may alone be suitable in this regard. Furthermore, wetting agents may be employed such as fatty acid esters, e.g., N-tallow-1,3-diaminopropane di-oleate; N-tallow trimethylene diamine diacetate; N-coco trimethylene diamine, beta diamines; N-oleyl trimethylene diamine; N-tallow trimethylene diamine; and N-tallow trimethylene diamine dioleate, and combinations thereof.

It should be kept in mind that the foregoing compositional ranges are preferred and it is not the intention to be limited to these ranges where one of ordinary skill in the art would recognize that these ranges may vary depending upon specific applications, specific components and conditions for processing and forming the end products. The paste according to the present invention may be conveniently prepared on a three-roll mill. The amount and type of carrier utilized are determined mainly by the final desired formulation viscosity, fineness of grind of the paste, and the desired wet print thickness. In preparing compositions according to the present invention, the particulate inorganic solids are mixed with the carrier and dispersed with suitable equipment, such as a three-roll mill, to form a suspension, resulting in a composition for which the viscosity will be in the range of about 100 to about 500 kcps, preferably about 300 to about 400 kcps, at a shear rate of 9.6 $sec^{-1}$ as determined on a Brookfield viscometer HBT, spindle 14, measured at 25° C.

Printing and Firing of the Paste. The aforementioned paste compositions may be used in a process to make a solar cell contact or other solar cell components. The inventive method of making solar cell contacts comprises (1) applying a silver-containing paste to the silicon substrate, (2) drying the paste, and (3) firing the paste to sinter the metal and make contact to silicon. The printed pattern of the paste is fired at a suitable temperature, such as about 650-950° C. furnace set temperature, or about 550-850° C. wafer temperature. Preferably, the furnace set temperature is about 750-930° C., and the paste is fired in air. During the firing the antireflective $SiN_x$ layer is believed to be oxidized and corroded by the glass and Ag/Si islands are formed on reaction with the Si substrate, which are epitaxially bonded to silicon. Firing conditions are chosen to produce a sufficient density of Ag/Si islands on the silicon wafer at the silicon/paste interface, leading to a low resistivity, high efficiency, high-fill factor front contact and solar cell.

A typical ARC is made of a silicon compound such as silicon nitride, generically $SiN_x$, such as $Si_3N_4$. This layer acts as an insulator, which tends to increase the contact resistance. Corrosion of this ARC layer by the glass component is hence a necessary step in front contact formation. The inventors herein have discovered that reducing the resistance between the silicon wafer and the paste is facilitated by the formation of epitaxial silver/silicon conductive islands at the interface. That is, the silver islands on silicon assume the same crystalline structure as is found in the silicon substrate. When such an epitaxial silver/silicon interface does not result, the resistance at that interface becomes unacceptably high. Until now, the processing conditions to achieve a low resistance epitaxial silver/silicon interface have been very narrow and difficult to achieve. The pastes and processes herein now make it possible to produce an epitaxial silver/silicon interface leading to a contact having low resistance under broad processing conditions—a minimum firing temperature as low as about 650° C., but which can be fired up to about 850° C. (wafer temperature). The pastes herein can be fired in air.

The formation of a low resistance front contact on a silicon solar cell is technically challenging. Both the interactions among paste constituents (silver metal, glass, additives, organics), and the interactions between paste constituents and silicon substrate are complex. However the interaction between paste constituents and silicon substrate must be controlled. The rapid furnace processing makes all the reactions highly dependent on kinetics. Further, the reactions of interest must take place within a very narrow region (<0.5 micron) of silicon in order preserve the P-N junction.

The properties discussed herein are believed to depend on a variety of variables, including the glass composition, amount of glass in the paste, silver morphology, and firing conditions. Several physical and chemical phenomena within the glass component must take place in order to form a front contact having low series resistance ($R_S$). Optimization of front contact properties requires fine tuning of firing temperature and conditions because small changes in the temperature—temperature variations with in the PV cell, between cells, furnace-to-furnace, cell lot to cell lot—can have a large effect on the performance of a cell. It is believed that resistance is decreased and conductivity is increased by increasing the number and quality of contacts between silver and silicon (that is, epitaxial silver-silicon islands) provided the interlayer glass thickness is minimized. If the paste is fired at too low a temperature, a high series resistance results because silver and silicon fail to react sufficiently at the Ag/Si interface. Conversely, if the paste is fired at too high a temperature, the PN junction in the silicon wafer is affected by excessive silver diffusion into silicon (and away from the interface), thereby reducing cell performance due to reduced $R_{sh}$. A high $R_{sh}$ is needed for good cell performance.

Method of Front Contact Production. A solar cell contact according to the present invention may be produced by applying any conductive paste disclosed herein to a substrate, for example by screen-printing, to a desired wet thickness, e.g., from about 40 to about 80 microns. Automatic screen-printing techniques can be employed using a 200-325 mesh screen. The printed pattern is then dried at 200° C. or less, preferably at about 120° C. for about 5-15 minutes before firing. The dry printed pattern can be fired for as little as 1 second up to about 5 minutes at peak temperature, in a belt conveyor furnace in air. During firing, the glass is fused and the metal is sintered.

Nitrogen ($N_2$) or another inert atmosphere may be used if desired. The firing is generally according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures. For example a three-zone firing profile may be used, with a belt speed of about 1 to about 4 meters (40-160 inches) per minute, preferably 3 meters/minute (about 120 inches/minute). In a preferred example, zone 1 is about 7 inches (18 cm) long, zone 2 is about 16 inches (40 cm) long, and zone 3 is about 7 inches (18 cm) long. The temperature in each successive zone is typically higher than the previous, for example, 700-790° C. in zone 1, 800-850° C. in zone 2, and 800-970° C. in zone 3. Naturally, firing arrangements having more than 3 zones are envisioned by the present invention, including 4, 5, 6, or 7, zones or more, each with zone lengths of about 5 to about 20 inches and firing temperatures of 650 to 1000° C.

Experimental Examples: Polycrystalline silicon wafers, 12.5 cm×12.5 cm, thickness 250-300 μm, were coated with a silicon nitride antireflective coating. The sheet resistivity of these wafers was about 1 Ω-cm.

Commercially available back surface field aluminum paste (Ferro CN53-038) and backside silver paste (Ferro CN33-451) were used for the back contact. The front contact pattern was printed using a 280 mesh screen with 100 μm openings for finger lines and with about a 2.8 mm spacing between the lines. Glass compositions used in the exemplary pastes were prepared by known glass-making techniques, and are presented in Table 4, the properties of those glass compositions are in Table 5, and the paste compositions are in Table 6. Samples were dried at about 100 to about 150° C. for about 3 to about 15 minutes after printing the front contacts. The printed wafers were co-fired using a 3-zone infrared (IR) belt furnace with a belt speed of about 3 meters (120") per minute, with temperature settings of 780° C., 810° C., and 930° C. for the three zones. The zones were 7", 16", and 7" long, respectively. The fired finger width for most samples was about 120 to about 170 μm, and the fired thickness was about 10 to 15 μm.

Electrical performance of the solar cells was measured with a solar tester, Model 91193-1000, Oriel Instrument Co., Stratford, Conn., under AM 1.5 sun conditions, in accordance with ASTM G-173-03. The results of this electrical testing are presented in Table 7.

TABLE 4

Exemplary Glass Compositions

| mole % | A | B | C | D | E |
|---|---|---|---|---|---|
| PbO | 31.3 | 61.6 | 61.5 | 58.9 | 61.9 |
| ZnO | 30.0 | | | | |
| $SiO_2$ | 29.8 | 30.3 | 27.2 | 28.7 | 30.1 |
| $Al_2O_3$ | 8.0 | 3.3 | 5.6 | 7.7 | |
| $B_2O_3$ | | | 2.4 | | |
| $Ta_2O_5$ | 0.9 | | | | |
| $ZrO_2$ | | 1.6 | 2.0 | | |
| $P_2O_5$ | | 3.3 | | | |
| $Sb_2O_5$ | | | 1.4 | | |
| $Ga_2O_3$ | | | | | 8.0 |
| $HfO_2$ | | | | 4.8 | |

Properties of the glass compositions A-E are set forth in the following Table 5. Tg stands for glass transition temperature; TCE is thermal coefficient of expansion over the range of 25-300° C.

TABLE 5

Glass Properties

| Glass properties | A | B | C | D | E |
|---|---|---|---|---|---|
| Tg, ° C. | 498 | 404 | 390 | — | 404 |
| TCE, (25-300° C.) × $10^{-7}$/° C. | 68 | 105 | 98 | 105 | 97 |
| Density, gm/cc | 5.8 | 6.7 | 6.5 | 6.8 | 6.3 |

Paste formulations in Table 6 were made using organic vehicles V131 and V132, commercially available from Ferro Corporation, Cleveland, Ohio. All amounts in Table 6 are in weight percent of the paste, including the solids portion and the organics portion.

TABLE 6

Paste Formulations

| | Paste | | | | | |
|---|---|---|---|---|---|---|
| Ingredients in wt % | 1 | 2 | 3 | 4 | 5 | 6 |
| Glass component | A | B | C | D | E | B |
| Glass component in paste | 4.5 | 4.5 | 4.5 | 4.5 | 4.5 | 4.5 |
| Silver flake, SF-23 | | | | | | 73.0 |
| Silver powder, Ag3000-1 | 68 | 68 | 68 | 68 | 68 | |
| Colloidal silver, RDAGCOLB | 12.4 | 12.4 | 12.4 | 12.4 | 12.4 | 5.0 |
| Vehicle V131 | 0.6 | 6.5 | 0.6 | 0.6 | 0.6 | 17.5 |
| Vehicle V132 | 14.5 | 8.6 | 14.5 | 14.5 | 14.5 | |

The front contact pastes in Table 6 were fired according to the firing profile disclosed herein. The electrical properties of the resultant solar cells are set forth in Table 7.

TABLE 7

Properties of Solar cells made with front contact pastes of Table 6.

| | Paste | | | | | |
|---|---|---|---|---|---|---|
| | 1 | 2 | 3 | 4 | 5 | 6 |
| | Glass | | | | | |
| | A | B | C | D | E | B |
| Isc, A | 4.73 | 4.93 | 4.73 | 4.83 | 4.72 | 4.89 |
| Voc, mV | 597 | 605 | 601 | 602 | 598 | 600 |
| Efficiency, % | 13.9 | 14.7 | 14.1 | 14.3 | 11.0 | 14.1 |
| Fill Factor, % | 76.5 | 77.2 | 76.1 | 76.6 | 61.1 | 75.2 |
| Rs, mΩ | 8.5 | 8.1 | 8.8 | 8.8 | 21.7 | 8.8 |
| Rsh, Ω | 31.7 | 29 | 20 | 38 | 22.3 | 8.0 |

Isc means short circuit current, measured at zero output voltage; Voc means open circuit voltage measured at zero output current; $R_S$ and $R_{sh}$ were previously defined.

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

What is claimed is:

1. A composition for forming a solar cell contact, the composition comprising:
    an organic portion; and
    a solids portion comprising:
        from about 85% to about 99% by weight of a conductive metal component consisting of a silver component; and
        from about 1% to about 15% by weight of a glass component wherein the glass component consists of 15 mol % to 75 mol % PbO, 5 mol % to 50 mol % $SiO_2$, about 0.1 mol % to about 15 mol % $Al_2O_3$, about 0.1 mol % to about 8 mol % $P_2O_5$, optionally about 0.1 mol % to about 10 mol % $Ta_2O_5$, and optionally about 0.1 mol % to about 10 mol % $ZrO_2$, and is free of $B_2O_3$.

2. The composition of claim 1 wherein the weight ratio of the solids portion to the organics portion is from about 20:1 to about 1:20.

3. The composition of claim 2 wherein the solids portion comprises a crystalline additive selected from the group consisting of $Bi_2O_3$, $Sb_2O_3$, $In_2O_3$, $Ga_2O_3$, SnO, ZnO, $Pb_3O_4$, PbO, $SiO_2$, $ZrO_2$, $Al_2O_3$, $B_2O_3$, $Ta_2O_5$, $4PbO \cdot SiO_2$, 3PbO.

$SiO_2$, $2PbO.SiO_2$, $3PbO.2SiO_2$, $PbO.SiO_2$, $ZnO.SiO_2$, and $ZrO_2.SiO_2$, and reaction products thereof and combinations thereof.

4. The composition of claim 2 wherein the solids portion comprises from about 60 weight % to about 95 weight % of flaked silver or powdered silver, and from about 0.1 weight % to about 20 weight % of colloidal silver, based upon 100% total weight of the solids portion.

5. The composition of claim 2 wherein the silver component comprises silver selected from the group consisting of flakes, powder, colloidal particles of silver and combinations thereof, wherein the solids portion further comprises phosphorus, at least a portion of which is present as a coating on at least a portion of the selected silver flakes, powder colloidal particles, and combinations thereof.

6. The composition of claim 2 wherein the solids portion comprises a crystalline additive selected from the group consisting of $Sb_2O_3$, $In_2O_3$, $Ga_2O_3$, $SnO$, $ZnO$, $Pb_3O_4$, $PbO$, $SiO_2$, $ZrO_2$, $Al_2O_3$, $B_2O_3$, $Ta_2O_5$, $4PbO.SiO_2$, $3PbO.SiO_2$, $2PbO.SiO_2$, $3PbO.2SiO_2$, $PbO.SiO_2$, $ZnO.SiO_2$, and $ZrO_2.SiO_2$, and reaction products thereof and combinations thereof.

7. The composition of claim 1 wherein the glass component further includes from about 1 mol % to about 30 mol % $Bi_2O_3$.

8. The composition of claim 1 wherein the glass component includes from about 0.1 mol % to about 10 mol % $Ta_2O_5$.

9. The composition of claim 8 wherein the glass component includes from about 0.1 mol % to about 10 mol % $ZrO_2$.

10. The composition of claim 1 wherein the glass component further includes from about 0.1 mol % to about 15 mol % $HfO_2+In_2O_3+Ga_2O_3$.

11. The composition of claim 1 wherein the silver component contains a compound selected from the group consisting of an oxide of silver, a salt of silver, and combinations thereof.

12. The composition of claim 1 wherein the solids portion consists of:
the conductive metal component;
the glass component;
optionally a crystalline additive selected from the group consisting of $Bi_2O_3$, $Sb_2O_3$, $In_2O_3$, $Ga_2O_3$, $SnO$, $ZnO$, $Pb_3O_4$, $PbO$, $SiO_2$, $ZrO_2$, $Al_2O_3$, $Ta_2O_5$, $4PbO.SiO_2$, $3PbO.SiO_2$, $2PbO.SiO_2$, $3PbO.2SiO_2$, $PbO.SiO_2$, $ZnO.SiO_2$, and $ZrO_2.SiO_2$, and reaction products thereof and combinations thereof;
optionally phosphorus component, silicon, carbon powder, or combinations thereof; and
optionally a low melting metal additive selected from the group consisting of Pb, Bi, Zn, In, Ga, and Sb and alloys of the at least one metal with at least one other metal.

13. The composition of claim 12 wherein the phosphorous component comprises $P_2O_5$.

14. The composition of claim 1 wherein the silver component contains a salt of silver.

15. The composition of claim 1 wherein the solids portion consists of:
the conductive metal component;
the glass component; and
a crystalline additive selected from the group consisting of $Bi_2O_3$, $Sb_2O_3$, $In_2O_3$, $Ga_2O_3$, $SnO$, $ZnO$, $Pb_3O_4$, $PbO$, $SiO_2$, $ZrO_2$, $Al_2O_3$, $Ta_2O_5$, $4PbO.SiO_2$, $3PbO.SiO_2$, $2PbO.SiO_2$, $3PbO.2SiO_2$, $PbO.SiO_2$, $ZnO.SiO_2$, and $ZrO_2.SiO_2$, and reaction products thereof and combinations thereof.

16. The composition of claim 1 wherein the solids portion consists of:
the conductive metal component; and
the glass component.

17. The composition of claim 1 wherein at least portion of the metal conductive component is silver oxide and the silver oxide is dissolved in the glass component.

18. A composition comprising:
a solids portion; and
an organics portion;
wherein the solids portion comprises:
  i. from about 85 to about 99 weight % of a conductive metal component consisting of silver, and
  ii. from about 1 to about 15 weight % of glass component,
  iii. wherein the glass component comprises:
    a. from about 58 to about 70 mol % PbO,
    b. from about 20 to about 31 mol % $SiO_2$, and
    c. about 1 to about 11 mol % $Al_2O_3$, and
    d. optionally about 0.1 to about 10 mol % $Ta_2O_5$
    e. optionally about 0.1 to about 10 mol % $ZrO_2$,
    f. about 0.1 mol % to about 8 mol % $P_2O_5$, and
    g. no $B_2O_3$.

19. The composition of claim 18 wherein the weight ratio of the solids portion to the organics portion is from about 20:1 to about 1:20.

20. The composition of claim 18 wherein the glass component comprises about 0.1 to about 10 mol % $Ta_2O_5$.

21. The composition of claim 20 wherein the glass component comprises about 0.1 to about 10 mol % $ZrO_2$.

22. The composition of claim 18 wherein the glass component further comprises about 0.1 to about 15 mol % $HfO_2+In_2O_3+Ga_2O_3$.

23. The composition of claim 18 wherein the solids portion further comprises a crystalline additive selected from the group consisting of $Bi_2O_3$, $Sb_2O_3$, $In_2O_3$, $Ga_2O_3$, $SnO$, $ZnO$, $Pb_3O_4$, $PbO$, $SiO_2$, $ZrO_2$, $Al_2O_3$, $Ta_2O_5$, $4PbO.SiO_2$, $3PbO.SiO_2$, $2PbO.SiO_2$, $3PbO.SiO_2$, $PbO.SiO_2$, $ZnO.SiO_2$, and $ZrO_2.SiO_2$, and reaction products thereof and combinations thereof.

24. The composition of claim 18 wherein the solids portion comprises about 60 to about 95 weight % of flaked silver or powdered silver, and about 0.1 to about 20 weight % of colloidal silver.

25. The composition of claim 18 wherein the silver is in a form selected from the group consisting of flakes, powder, colloidal particles of silver, and combinations thereof, and wherein the solids portion further comprises phosphorus, at least a portion of which is present as a coating on at least a portion of the silver flakes, powder or colloidal particles, or combinations thereof.

26. The composition of claim 18 wherein the silver component contains a compound selected from the group consisting of an oxide of silver, a salt of silver, and combinations thereof.

27. The composition of claim 18 wherein the solids portion further comprises at least one metal selected from the group consisting of Pb, Bi, Zn, In, Ga, and Sb and alloys of the at least one metal with at least one other metal.

28. The composition of claim 27 wherein the at least one metal is zinc.

29. The composition of claim 18 wherein the solids portion consists of:
the conductive metal component;
the glass component;
optionally a crystalline additive selected from the group consisting of $Bi_2O_3$, $Sb_2O_3$, $In_2O_3$, $Ga_2O_3$, $SnO$, $ZnO$, $Pb_3O_4$, $PbO$, $SiO_2$, $ZrO_2$, $Al_2O_3$, $Ta_2O_5$, $4PbO.SiO_2$, $3PbO.SiO_2$, $2PbO.SiO_2$, $3PbO.2SiO_2$, $PbO.SiO_2$, $ZnO.SiO_2$, and $ZrO_2.SiO_2$, and reaction products thereof and combinations thereof;

optionally phosphorus component, silicon, carbon powder, or combinations thereof; and optionally a low melting metal additive selected from the group consisting of Pb, Bi, Zn, In, Ga, and Sb and alloys of the at least one metal with at least one other metal.

30. A composition comprising:
an organics portion; and
a solids portion, wherein the solids portion comprises
  i. from about 85 to about 99 wt % of a conductive metal component consisting of a silver component, and
  ii. from about 1 to about 15 wt % of a glass component
  iii. wherein the glass component comprises
    a. from about 58 to about 70 mol % PbO,
    b. from about 20 to about 31 mol % $SiO_2$,
    c. at least 1 mol % $Bi_2O_3$,
    d. about 0.1 to about 15 mol % $Al_2O_3$,
    e. optionally about 0.1 to about 10 mol % $Ta_2O_5$,
    f. optionally about 0.1 to about 10 mol % $ZrO_2$,
    g. about 0.1 mol % to about 8 mol % $P_2O_5$, and
    h. no $B_2O_3$.

31. The composition of claim 30, wherein the solids portion further comprises about 0.1 to about 10 mol % $Ta_2O_5$.

32. The composition of claim 30 wherein the solids portion consists of:
the conductive metal component;
the glass component;
optionally a crystalline additive selected from the group consisting of $Bi_2O_3$, $Sb_2O_3$, $In_2O_3$, $Ga_2O_3$, SnO, ZnO, $Pb_3O_4$, PbO, $SiO_2$, $ZrO_2$, $Al_2O_3$, $Ta_2O_5$, $4PbO.SiO_2$, $3PbO.SiO_2$, $2PbO.SiO_2$, $3PbO.2SiO_2$, $PbO.SiO_2$, $ZnO.SiO_2$, and $ZrO_2.SiO_2$, and reaction products thereof and combinations thereof;
optionally phosphorus component, silicon, carbon powder, or combinations thereof; and
optionally a low melting metal additive selected from the group consisting of Pb, Bi, Zn, In, Ga, and Sb and alloys of the at least one metal with at least one other metal.

33. A composition for forming a solar cell contact, the composition comprising:
an organic portion; and
a solids portion comprising:
  from about 85% to about 99% by weight of a conductive metal component consisting of silver powder and colloidal silver; and
  from about 1% to about 15% by weight of a glass component wherein the glass component consists of 15 mol % to 75 mol % PbO, 5 mol % to 50 mol % $SiO_2$, about 0.1 mol % to about 15 mol % $Al_2O_3$, about 0.1 mol % to about 8 mol % $P_2O_5$, optionally about 0.1 mol % to about 10 mol % $Ta_2O_5$, and about 0.1 mol % to about 10 mol % $ZrO_2$, and is free of $B_2O_3$.

* * * * *